(12) United States Patent
Kim et al.

(10) Patent No.: US 8,854,157 B2
(45) Date of Patent: Oct. 7, 2014

(54) BALUN COMPRISING TWO CONVERSION CIRCUITS EACH CONSTITUTED BY FIRST TO THIRD FBARS

(75) Inventors: Duck Hwan Kim, Goyang-si (KR); Dal Ahn, Asan-si (KR); Chul Soo Kim, Hwaseong-si (KR); In Sang Song, Yongin-si (KR); Yun Kwon Park, Dongducheon-si (KR); Jea Shik Shin, Hwaseong-si (KR); Hyung Rak Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 350 days.

(21) Appl. No.: 12/834,099

(22) Filed: Jul. 12, 2010

(65) Prior Publication Data
US 2011/0095849 A1     Apr. 28, 2011

(30) Foreign Application Priority Data
Oct. 28, 2009  (KR) .................. 10-2009-0102540

(51) Int. Cl.
*H03H 9/00* (2006.01)
(52) U.S. Cl.
CPC ................... *H03H 9/0095* (2013.01)
USPC ............................................................. 333/189
(58) Field of Classification Search
CPC ... H03H 9/0023; H03H 9/0095; H03H 9/605; H03H 9/703
USPC ................... 333/189, 190, 25, 117, 118, 124
See application file for complete search history.

(56) References Cited

U.S. PATENT DOCUMENTS

| | | | |
|---|---|---|---|
| 6,803,835 B2 | 10/2004 | Frank | |
| 7,102,460 B2 | 9/2006 | Schmidhammer et al. | |
| 7,212,085 B2 | 5/2007 | Wu | |
| 7,242,268 B2 * | 7/2007 | Hagiwara et al. | 333/133 |
| 7,446,629 B2 * | 11/2008 | Nakamura et al. | 333/133 |
| 2003/0179053 A1 * | 9/2003 | Aigner et al. | 333/189 |
| 2009/0273408 A1 * | 11/2009 | Inoue et al. | 333/4 |

FOREIGN PATENT DOCUMENTS

| | | |
|---|---|---|
| JP | 2006-074749 | 3/2006 |
| KR | 10-2004-0079412 | 9/2004 |
| KR | 10-2006-0027506 | 3/2006 |

* cited by examiner

*Primary Examiner* — Benny Lee
(74) *Attorney, Agent, or Firm* — NSIP Law

(57) ABSTRACT

Disclosed is a balun including a film bulk acoustic resonator (FBAR). The balun may be implemented using the FBAR to fabricate a small sized balun. Also, the balun may be implemented using the FBAR, thereby reducing a difference in two outputs.

2 Claims, 16 Drawing Sheets

400

600

1200

1210

BALUN COMPRISING TWO CONVERSION CIRCUITS EACH CONSTITUTED BY FIRST TO THIRD FBARS

CROSS-REFERENCE TO RELATED APPLICATION(S)

This application claims the benefit under 35 U.S.C. §119(a) of Korean Patent Application No. 10-2009-0102540, filed on Oct. 28, 2009, in the Korean Intellectual Property Office, the entire disclosure of which is incorporated herein by reference for all purposes.

BACKGROUND

1. Field

The following description relates to a balun, and more particularly, to a balun including a film bulk acoustic resonator (FBAR) that may convert a balanced signal into an unbalanced signal, and/or convert an unbalanced signal into a balanced signal.

2. Description of Related Art

A balun may be used as a circuit/structure that may convert balanced signals into unbalanced signals or unbalanced signals into balanced signals. The balun may include a passive element that may operate even when an input and an output are reversed.

A conventional balun is fabricated to include a plurality of transistors, or using a wavelength of a signal on a single plane. The conventional balun is a part of a parallel type circuit such as a mixer, an amplifier, a multiplier, a phase shifter, and the like, and is generally implemented using a Lange coupler or an interdigital coupling.

However, the size of the balun using the wavelength of the signal plane may be significantly great. Also, a balun including a plurality of transistors may have a large difference between two outputs, and a supplementary circuit may need to be inserted in the balun to correct the difference between outputs. In addition, the power consumption of the conventional balun is relatively great due to the plurality of transistors, and the yield of the circuit may be reduced by such power consumption. Accordingly, these two types of baluns may cause a reduction in a degree of integration of a semiconductor, and therefore may not be readily implemented in an integrated circuit.

SUMMARY OF THE INVENTION

In one general aspect, there is provided, a balun including two conversion units to control the phase of an input signal, the two conversion units including at least one film bulk acoustic resonator (FBAR) and at least one passive element that is connected with the at least one FBAR.

At least one of the two conversion units may include two FBARs connected to a ground, and the passive element may be located between the two FBARs.

At least one of the two conversion units may include two passive elements connected to a ground, and the FBAR may be located between the two passive elements.

At least one of the two conversion units may include two FBARs, and the passive element may be located between the two FBARs and connected to a ground.

At least one of the two conversion units may include two passive elements, and the FBAR may be located between the two passive elements and may be connected to a ground.

The passive element may be at least one of a capacitor and an inductor.

The FBAR may be at least one of a bulk acoustic wave resonator (BAWR) and a thin film bulk acoustic resonator (TFBAR).

The FBAR may be connected in series with a capacitor to change a frequency response characteristic.

The FBAR may be connected in parallel with a capacitor to change a frequency response characteristic.

The FBAR may be connected in series with an inductor to change a frequency response characteristic.

The FBAR may be connected in parallel with an inductor to change a frequency response characteristic.

In another aspect, there is provided a balun including two conversion units to control the phase of an input signal, the two conversion units including a first FBAR connected to a ground, a second FBAR connected to the ground, and a third FBAR located between the first FBAR and the second FBAR.

In another aspect, there is provided a balun including two conversion units to control the phase of an input signal, the two conversion units including a first FBAR, a second FBAR, and a third FBAR located between the first FBAR and the second FBAR, the third FBAR also being connected to a ground.

Other features and aspects may be apparent from the following description, the drawings, and the claims.

BRIEF DESCRIPTION OF THE DRAWINGS

Throughout the drawings and the description, unless otherwise described, the same drawing reference numerals should be understood to refer to the same elements, features, and structures. The relative size and depiction of these elements may be exaggerated for clarity, illustration, and convenience.

DETAILED DESCRIPTION OF THE INVENTION

The following description is provided to assist the reader in gaining a comprehensive understanding of the methods, apparatuses, and/or systems described herein. Accordingly, various changes, modifications, and equivalents of the methods, apparatuses, and/or systems described herein may be suggested to those of ordinary skill in the art. The progression of processing steps and/or operations described is an example; however, the sequence of steps and/or operations is not limited to that set forth herein and may be changed as is known in the art, with the exception of steps and/or operations necessarily occurring in a certain order. Also, description of well-known functions and constructions may be omitted for increased clarity and conciseness.

Figure 1:
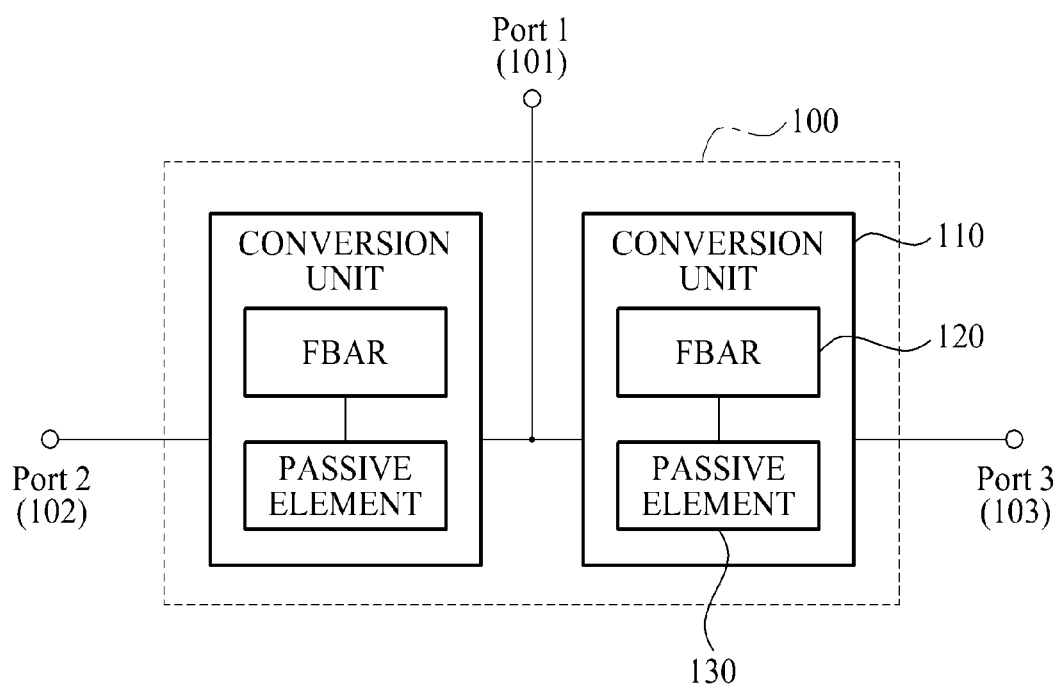
FIG. 1 is a diagram illustrating an example of a balun.

FIG. 1 illustrates an example of a balun.

Referring to FIG. 1, balun 100 includes two conversion units 110. Each conversion unit 110 includes a film bulk acoustic resonator (FBAR) 120 and a passive element 130 connected with the FBAR.

The balun 100 may receive as an input a signal via a first port 101.

The conversion unit 110 may include at least one FBAR 120 and at least one passive element 130 connected with the at least one FBAR 120. However, it should be understood that the conversion unit 110 may include more than one FBAR 120 and/or more than one passive element 130.

The conversion unit 110 may control a phase of the inputted signal via the first port 101. According to various embodiments, the conversion unit 110 may convert the inputted signal into a signal having the same amplitude as that of the inputted signal. For example, the conversion unit 110 may convert the inputted signal into a signal having a phase difference of 90 degrees between the phase of the inputted signal and a phase of the current signal, while at the same time having the same amplitude.

The passive element 130 may be, for example, a capacitor and/or an inductor. The FBAR 120 may be, for example, a bulk acoustic wave resonator (BAWR), a thin film bulk acoustic resonator (TFBAR), and the like.

The signal converted by the conversion unit 110 may be outputted via a second port 102 and/or a third port 103. For example, the conversion unit 110 may convert the inputted signal via the first port 101, such that the difference between the phase of the outputted signal via the second port 102 and the phase of the outputted signal via the third port 103 is 180 degrees.

FIGS. 2 through 11 illustrate various examples of a conversion unit.

Figure 2:
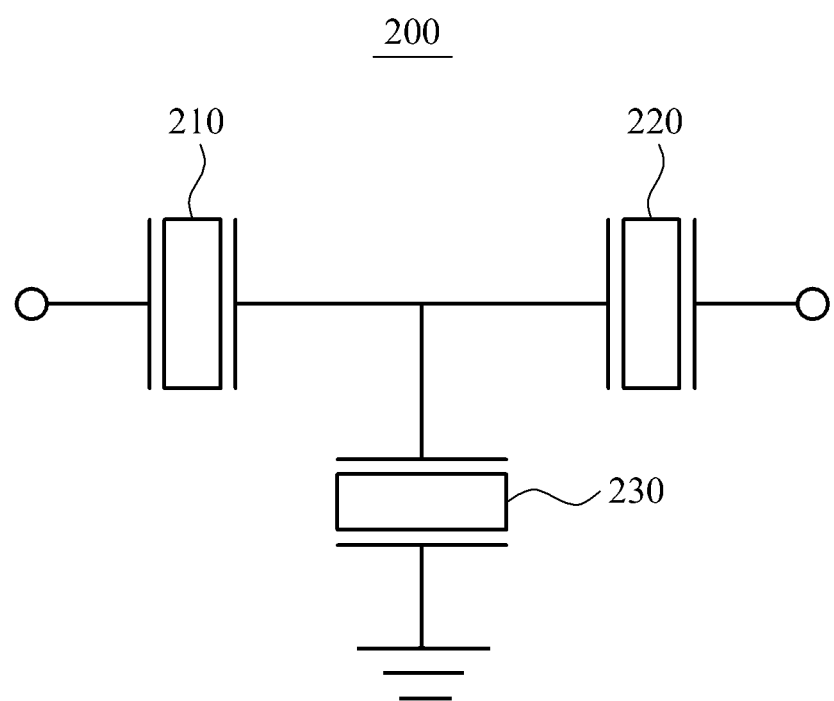
FIGS. 2 through 11 are diagrams illustrating examples of a conversion unit.

Referring to FIG. 2, conversion unit 200 includes a first FBAR 210, a second FBAR 220, and a third FBAR 230. A balun may include two conversion units to control a phase of an input signal, wherein each of the two conversion units are configured the same as the conversion unit 200. In this example, the third FBAR 230 is located between the first FBAR 210 and the second FBAR 220, and the third FBAR 230 may also be connected with a ground.

In this example, the conversion unit 200 includes the three FBARs 210, 220, and 230 that are configured in a T-shape.

Figure 3:
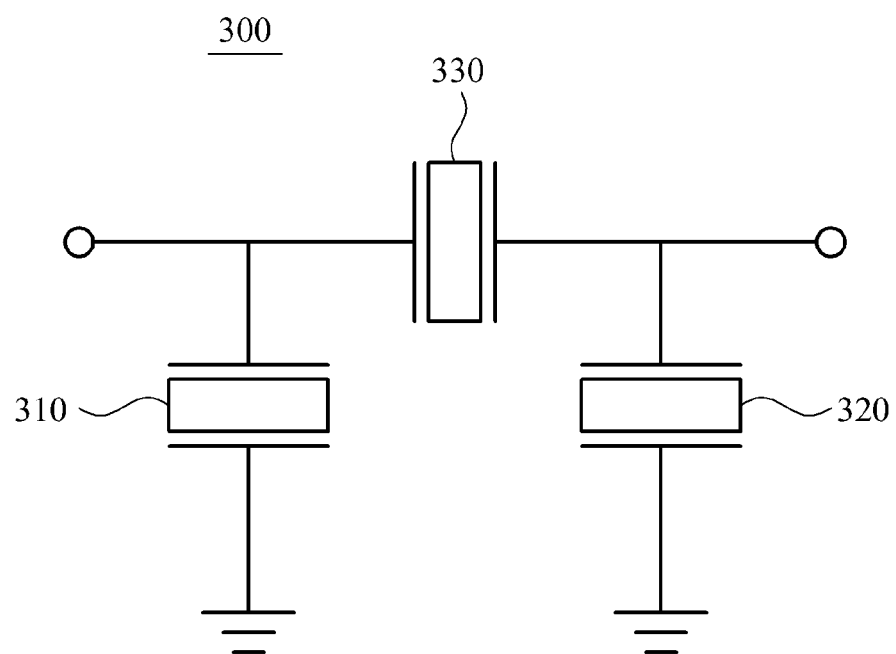

Referring to FIG. 3, the conversion unit 300 may be used to control the phase of an input signal and includes a first FBAR 310 connected with a ground, a second FBAR 320 connected with the ground, and a third FBAR 330 located between the first FBAR 310 and the second FBAR 320. A balun may include two conversion units to control a phase of an input signal, wherein each of the two conversion units are the same as the conversion unit 300.

In this example, the conversion unit 300 includes the three FBARs 310, 320, and 330 that are configured in the shape of a π symbol.

Accordingly, the balun may include two conversion units to control the phase of the input signal, and any one of the two conversion units may include two FBARs and a passive element. For example, the passive element may be located between the two FBARs, and connected with a ground.

Figure 4:
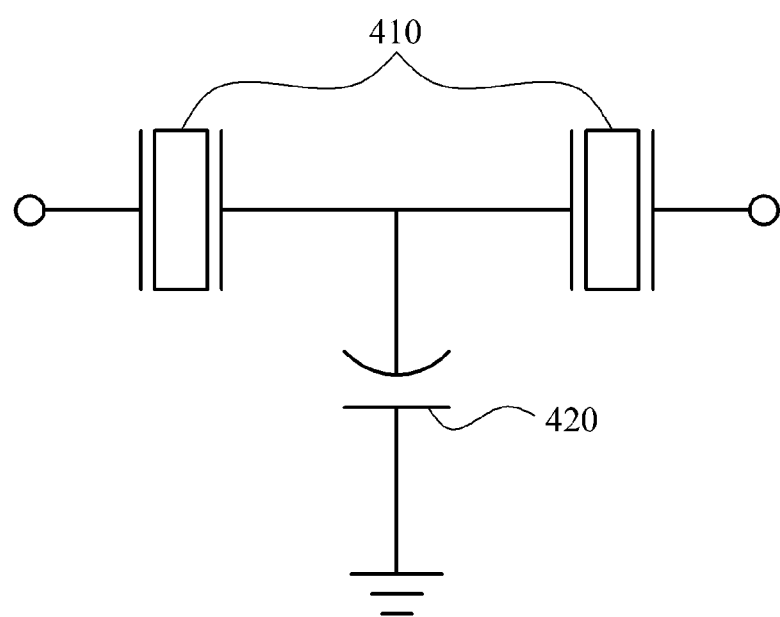

Referring to FIG. 4, conversion unit 400 includes two FBARs 410 and a capacitor 420. In this example, the capacitor 420 is located between the two FBARs 410, and connected with a ground. Also in this example, the conversion unit 400 includes the two FBARs 410 and the capacitor 420 that are configured in a T-shape.

Figure 5:
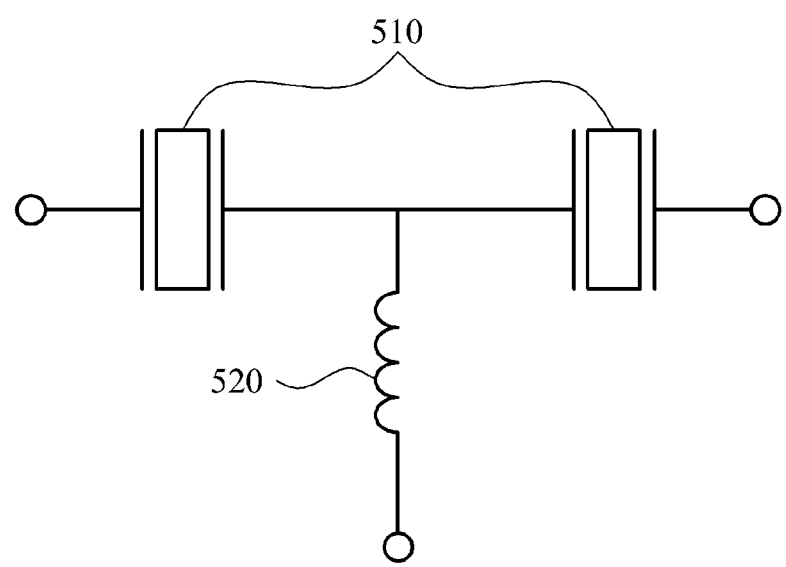

Referring to FIG. 5, conversion unit 500 includes two FBARs 510 and an inductor 520. For example, the inductor 520 may be located between the two FBARs 510, and connected with a ground. In this example, the conversion unit 500 includes the two FBARs 510 and the inductor 520 that are configured in a T-shape.

Accordingly, the balun may include two conversion units to control a phase of an input signal, and any one of the two conversion units may include two passive elements and an FBAR. For example, the FBAR may be located between the two passive elements and connected with a ground.

Figure 6:
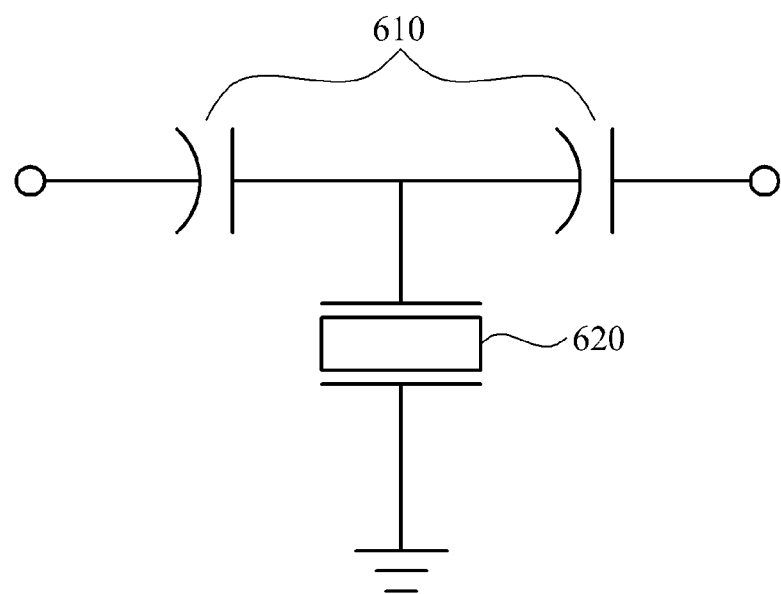

Referring to FIG. 6, conversion unit 600 includes two capacitors 610 and an FBAR 620 located between the two capacitors 610 and connected with a ground. In this example, the conversion unit 600 includes the two capacitors 610 and the FBAR 620 and that are configured in a T-shape.

Figure 7:
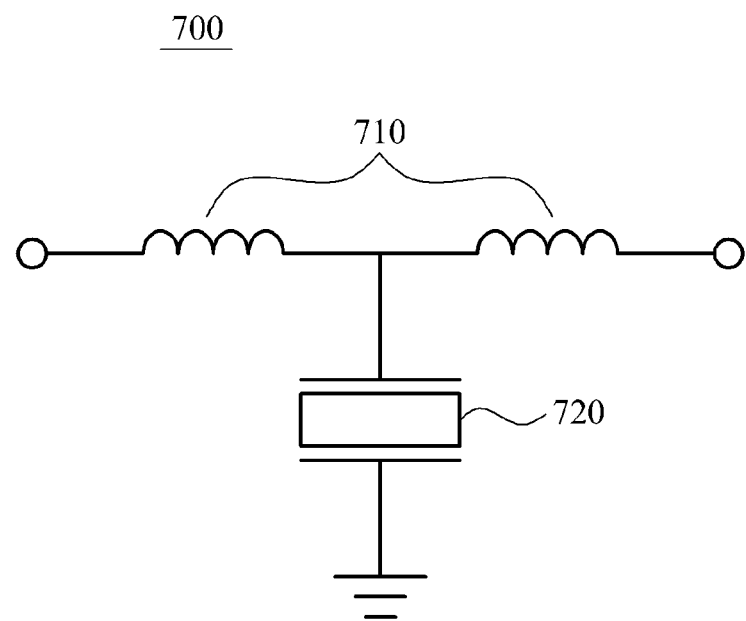

Referring to FIG. 7, conversion unit 700 includes two inductors 710 and an FBAR 720. For example, the FBAR 720 may be located between the two inductors 710 and connected with a ground. In this example, the conversion unit 700 includes the two inductors 710 and the FBAR 720 that are configured in a T-shape.

According to various aspects, the balun may include two conversion units to control the phase of an input signal, and, as is further discussed herein, any one of the two conversion units may include two FBARs and a passive element. For example, the two FBARs may be connected with a ground, and the passive element may be located between the two FBARs as shown in the examples of FIGS. 8 and 9.

Figure 8:
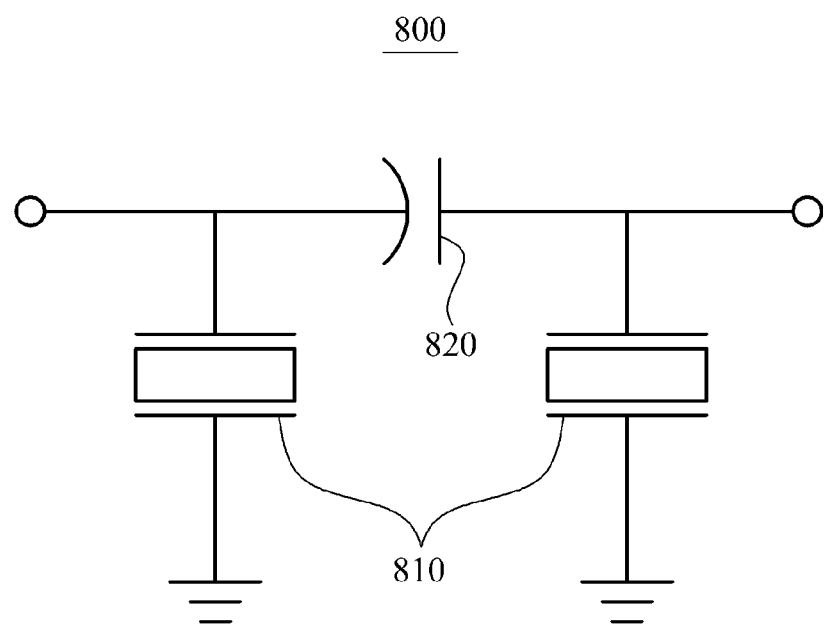

Referring to FIG. 8, conversion unit 800 includes two FBARs 810 and a capacitor 820. For example, the two FBARs 810 may be connected with a ground, and the capacitor 820 may be located between the two FBARs 810. In this example, the conversion unit 800 includes the two FBARs 810 and the capacitor 820 configured in the shape of a π symbol.

Figure 9:
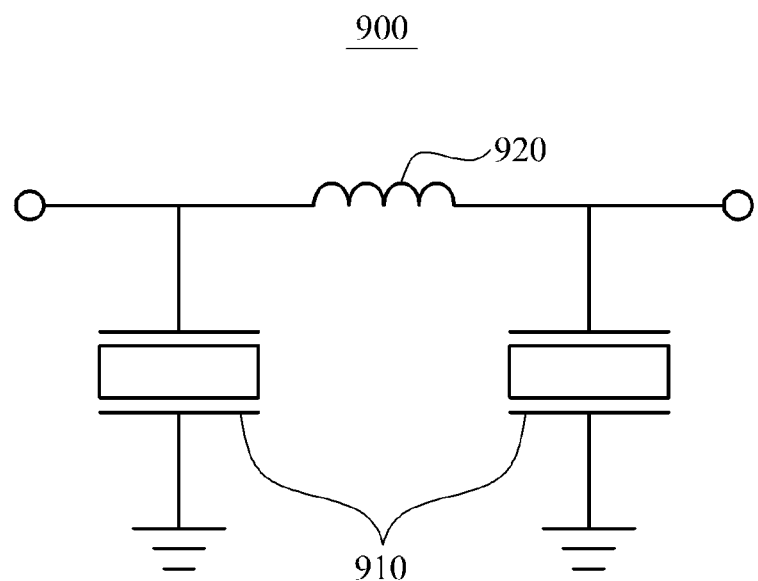

Referring to FIG. 9, conversion unit 900 includes two FBARs 910 and an inductor 920. For example, the two FBARs 910 may be connected with a ground, and the inductor 920 may be located between the two FBARs 910. In this example, the conversion unit 900 includes the two FBARs 910 and the inductor 920 configured in the shape of a π symbol.

Accordingly, the balun may include two conversion units to control the phase of an input signal, and any one of the two conversion units may include two passive elements and an FBAR. As another example, the two passive elements may be connected with a ground, and the FBAR may be located between the two passive elements.

Figure 10:
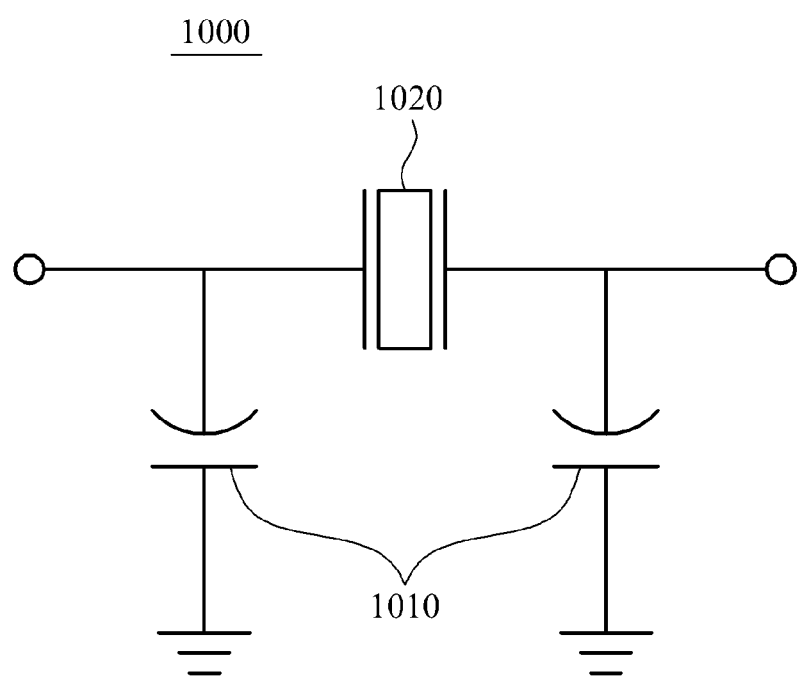

Referring to FIG. 10, conversion unit 1000 includes two capacitors 1010 and an FBAR 1020. For example, the two capacitors 1010 may be connected with a ground, and the FBAR 1020 may be located between the two capacitors 1010. In this example, the conversion unit 1000 includes the two capacitors 1010 and the FBAR 1020 that are configured in the shape of a π symbol.

Figure 11:
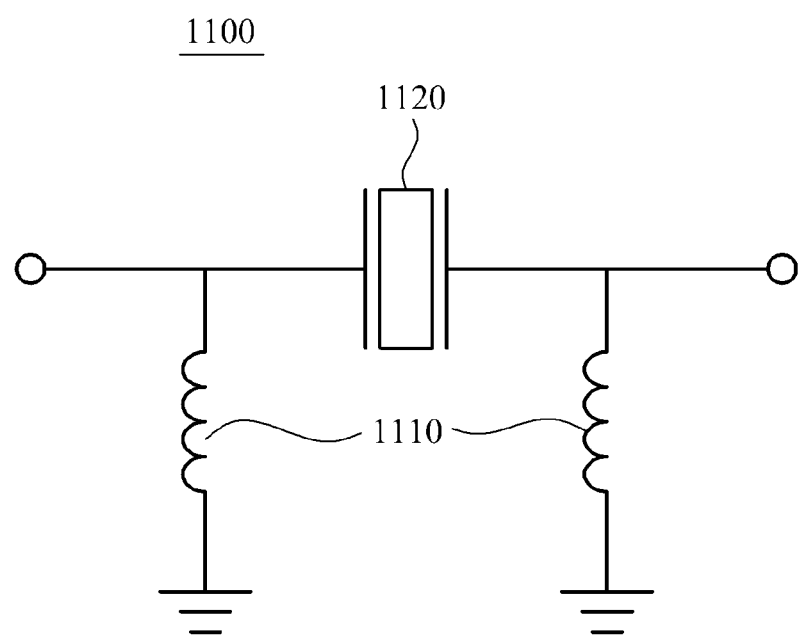

Referring to FIG. 11, conversion unit 1100 includes two inductors 1110 and an FBAR 1120. For example, the two inductors 1110 may be connected with a ground, and the FBAR 1120 may be located between the two inductors 1110. In this example, the conversion unit 1100 includes the two inductors 1110 and the FBAR 1120 that are configured in the shape of a π symbol.

Accordingly, the balun may include two conversion units, and each of the two conversion units may be one of the conversion units illustrated in FIGS. 2 through 11. For example, as for the balun including a first conversion unit and a second conversion unit, the first conversion unit may include three FBARs configured in a T-shape as illustrated in the example shown in FIG. 2, and the second conversion unit may include three FBARs configured in a shape of the symbol π as illustrated in the example shown in FIG. 3.

FIGS. 12 to 15 illustrate various examples of an FBAR.

Figure 12:
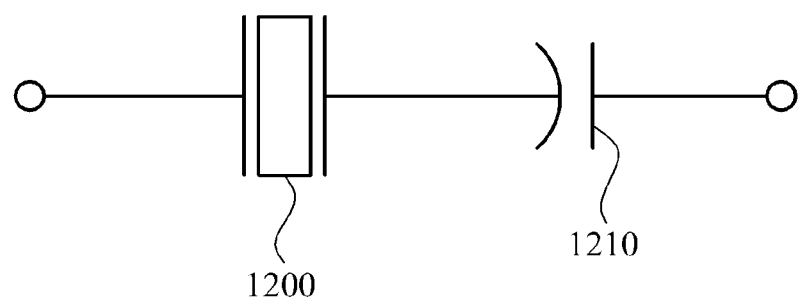
FIGS. 12 through 15 are diagrams illustrating examples of a film bulk acoustic resonator (FBAR).

Referring to FIG. 12, FBAR 1200 is connected in series with a capacitor 1210 to obtain a changed frequency response characteristic.

Figure 13:
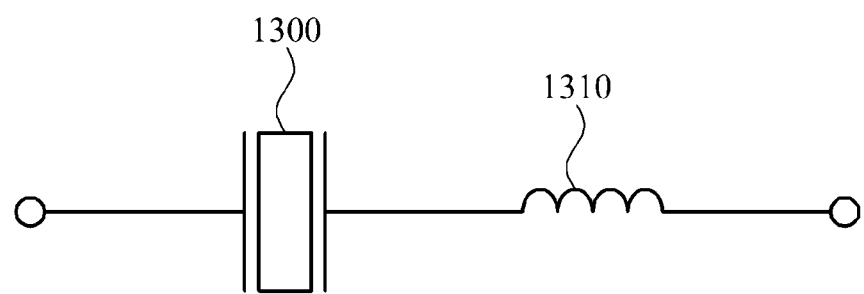

Referring to FIG. 13, FBAR 1300 is connected in series with an inductor 1310 to obtain a changed frequency response characteristic.

Figure 14:
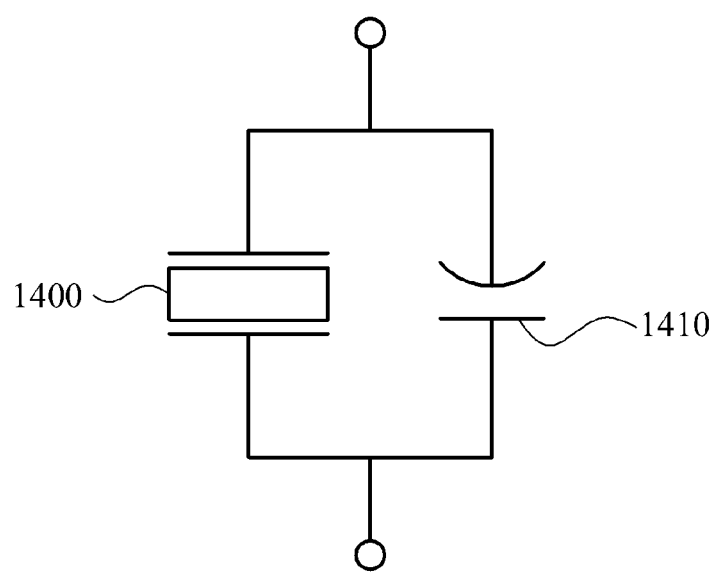

Referring to FIG. 14, FBAR 1400 may be connected in parallel with a capacitor 1410 to obtain a changed frequency response characteristic.

Figure 15:
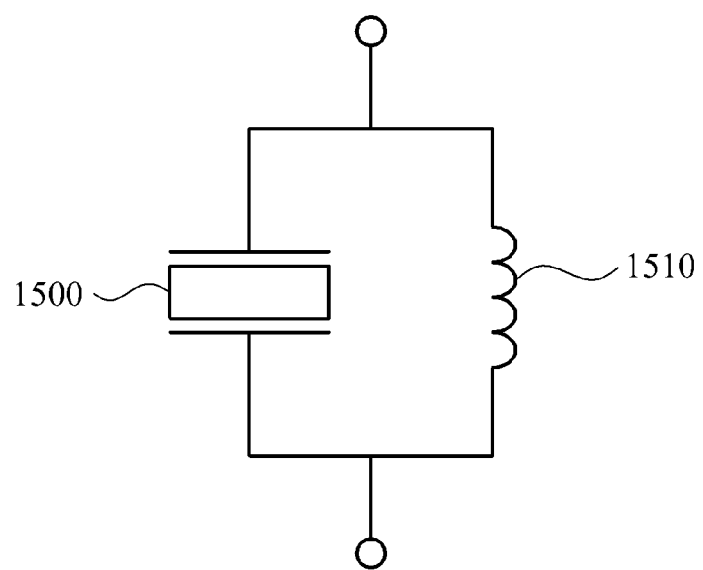

Referring to FIG. 15, FBAR 1500 is connected in parallel with an inductor 1510 to obtain a changed frequency response characteristic.

Accordingly, the balun may include two conversion units, and each of the two conversion units may include at least one FBAR. For example, the at least one FBAR may be connected in series or in parallel with a capacitor or an inductor to obtain the changed frequency response characteristic, as illustrated in the examples shown in FIGS. 12 through 15. A configuration in which the at least one FBAR is connected in series or in parallel with the capacitor or the inductor to obtain the changed frequency response characteristic is described with reference to FIG. 16.

Figure 16:
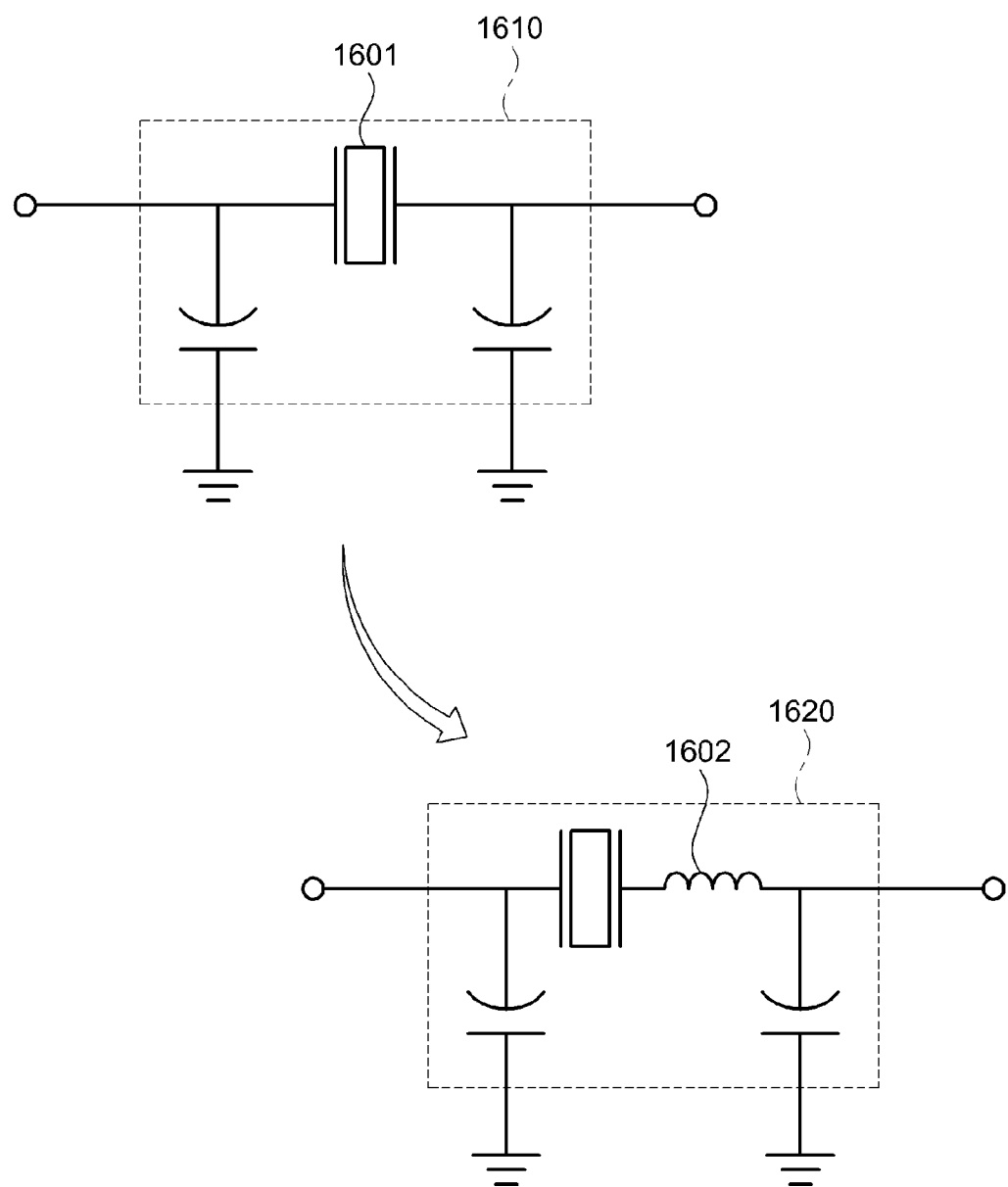
FIG. 16 is a diagram illustrating another example of a conversion unit.

FIG. 16 illustrates another example of a conversion unit. In this example, an additional inductor 1602 is added to conversion unit 1620 to obtain a changed frequency response characteristic.

Referring to FIG. 16, a conversion unit 1610 includes two capacitors and an FBAR 1601. For example, the two capacitors may be connected with a ground, and the FBAR 1601 may be located between the two capacitors. Also, the FBAR 1601 may be connected in series with an inductor 1602 to obtain a changed frequency response characteristic. In this example, the conversion unit 1620 includes the FBAR 1601 connected in series with the inductor 1602 to obtain the changed frequency response characteristic with the conversion unit 1610.

Accordingly, the example baluns described herein, including one or more FBARs, may have a minimal difference between two outputs, without the need for a supplementary circuit to be inserted in the balun to correct the difference between outputs. In addition, the power consumption of the baluns described herein may be reduced in comparison to the conventional balun including the plurality of transistors. Thus, the yield of the circuit may be reduced.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A balun, comprising:
two conversion units configured to control the phase of an input signal, the two conversion units each consisting of a first FBAR, a second FBAR, and a third FBAR located between the first FBAR and the second FBAR, the third FBAR being connected to a ground; and
a first port connected between the two conversion units and which is configured to receive an unbalanced signal, a second port connected to a first conversion unit from among the two conversion units, and a third port connected to a second conversion unit from among the two conversion units,
wherein the two conversion units are connected to each other in series.

2. The balun of claim 1, wherein the two conversion units convert a signal inputted via the first port, such that the difference between a phase of a signal outputted via the second port and a phase of an outputted signal via the third port is 180 degrees.

* * * * *